United States Patent
Doyle et al.

(10) Patent No.: US 7,485,541 B2
(45) Date of Patent: Feb. 3, 2009

(54) CREATION OF HIGH MOBILITY CHANNELS IN THIN-BODY SOI DEVICES

(75) Inventors: Brian S. Doyle, Portland, OR (US);
Brian E. Roberds, Escondido, CA (US)

(73) Assignee: Intel Corporation, Santa Clara, CA (US)

( * ) Notice: Subject to any disclaimer, the term of this patent is extended or adjusted under 35 U.S.C. 154(b) by 470 days.

(21) Appl. No.: 11/403,974

(22) Filed: Apr. 13, 2006

(65) Prior Publication Data

US 2006/0189096 A1    Aug. 24, 2006

Related U.S. Application Data

(62) Division of application No. 10/774,166, filed on Feb. 6, 2004, now Pat. No. 7,067,386, which is a division of application No. 09/895,579, filed on Jun. 29, 2001, now Pat. No. 6,717,213.

(51) Int. Cl.
*H01L 21/00* (2006.01)
(52) U.S. Cl. .................. 438/406; 438/407; 438/458
(58) Field of Classification Search .......... 438/458, 438/407, 406
See application file for complete search history.

(56) References Cited

U.S. PATENT DOCUMENTS

| | | | | |
|---|---|---|---|---|
| 5,882,987 A * | 3/1999 | Srikrishnan | .................. | 438/458 |
| 5,906,951 A * | 5/1999 | Chu et al. | ................... | 438/751 |
| 6,059,895 A * | 5/2000 | Chu et al. | ................... | 148/33.1 |
| 6,100,166 A * | 8/2000 | Sakaguchi et al. | .......... | 438/455 |
| 6,323,108 B1 * | 11/2001 | Kub et al. | .................... | 438/458 |
| 6,403,450 B1 * | 6/2002 | Maleville et al. | ............ | 438/471 |
| 6,410,371 B1 * | 6/2002 | Yu et al. | ...................... | 438/151 |
| 6,717,213 B2 * | 4/2004 | Doyle et al. | ................. | 257/347 |
| 6,852,652 B1 * | 2/2005 | Maa et al. | ................... | 438/197 |
| 6,991,956 B2 * | 1/2006 | Ghyselen et al. | .............. | 438/46 |
| 7,067,386 B2 * | 6/2006 | Doyle et al. | ................. | 438/407 |
| 7,067,430 B2 * | 6/2006 | Maa et al. | ................... | 438/705 |
| 7,247,545 B2 * | 7/2007 | Maa et al. | ................... | 438/455 |
| 7,265,030 B2 * | 9/2007 | Maa et al. | ................... | 438/458 |
| 2002/0081861 A1 * | 6/2002 | Robinson et al. | ........... | 438/742 |
| 2003/0003679 A1 * | 1/2003 | Doyle et al. | ................. | 438/406 |
| 2004/0157402 A1 * | 8/2004 | Doyle et al. | ................. | 438/406 |
| 2005/0070115 A1 * | 3/2005 | Maa et al. | ................... | 438/706 |
| 2006/0019464 A1 * | 1/2006 | Maa et al. | ................... | 438/458 |
| 2006/0185581 A1 * | 8/2006 | Aga et al. | ..................... | 117/89 |
| 2006/0189096 A1 * | 8/2006 | Doyle et al. | ................. | 438/458 |
| 2006/0205178 A1 * | 9/2006 | Doyle et al. | ................. | 438/455 |

* cited by examiner

*Primary Examiner*—Laura M Menz
(74) *Attorney, Agent, or Firm*—Blakely, Sokoloff, Taylor & Zafman LLP

(57) ABSTRACT

A method for fabricating a strained silicon film to a silicon on insulation (SOI) wafer. A layer of oxide is deposited onto a wafer that has a stack structure of a first base substrate, a layer of relaxed film=and a second layer of strained film. The SOI wafer has a stack structure of a second base substrate and a layer of oxidized film. The SOI wafer is attached to the wafer and is heated at a first temperature. This causes a silicon dioxide ($SiO_2$) dangling bond to form on the second base substrate of the SOI wafer, transferring the strained film from one wafer to the other.

6 Claims, 3 Drawing Sheets

CREATION OF HIGH MOBILITY CHANNELS IN THIN-BODY SOI DEVICES

CROSS-REFERENCES TO RELATED APPLICATIONS

This is a Divisional Application of Divisional application Ser. No. 10/774,166, filed Feb. 6, 2004 now U.S. Pat No. 7,067,386 which is a Division Application of U.S. patent application Ser. No. 09/895,579, filed Jun. 29, 2001, now U.S. Pat. No. 6,717,213. This Divisional Application claims the benefit of the Divisional application Ser. No. 10/774,166 and U.S. Pat. No. 6,717,213.

FIELD OF THE INVENTION

This invention relates to a method for fabricating strain on a wafer. In particular, the invention relates to a method for fabricating strain on a silicon-on-insulator (SOI) wafer.

BACKGROUND OF THE INVENTION

The mobility of the carriers in a device is directly related to the its current. The higher the current the faster the device is operated. Devices can be built as bulk devices, devices on silicon on insulator (SOI) or any other types. Each type has its own characteristics that make it attractive. As these devices are scaled down, one of the characteristics that may be of interest is the speed of metal oxide semiconductor (MOS) transistors. One way to make a speedier transistor is to create a thinner gate oxide and therefore create more capacitance, which results more charge. Another way is to create a high mobility channel.

To have a high mobility channel is to have high carriers mobility in the device. Straining the channel region of the MOS devices produces higher mobility of the carriers since tensile strained silicon causes increases in the mobility of both electrons and holes. Higher the mobility of these carriers means higher current; therefore faster devices or faster chips.

The method of growing strained silicon film on top of Silicon Germanium (SiGe) layer in bulk devices (e.g., silicon substrate) is standard and is well known in the art. Growing strained silicon film onto silicon-on-insulator wafer, however, is difficult since it would thicken the active silicon layer on the SOI beyond the range of useful interest.

A method of fabrication of a thin film strained silicon layer on an oxide substrate (i.e., thin body SOI) is described.

BRIEF DESCRIPTION OF THE DRAWINGS

The features and advantages of the present invention will become apparent from the following detailed description of the present invention in which.

DETAILED DESCRIPTION OF THE INVENTION

In the following, for purposes of explanation, numerous details are set forth in order to provide a thorough understanding of the present invention. However, it will be apparent to one skilled in the art that theses specific details are not required in order to practice the present invention.

Figure 1:
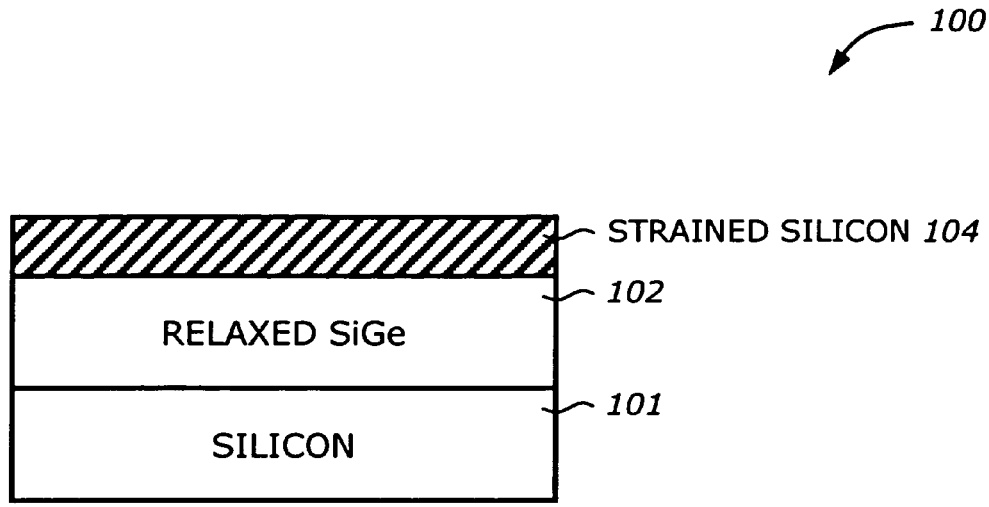
FIG. 1 is a diagram illustrating a sectional view of a wafer having a stack structure of a conventional substrate with a relaxed layer and a strained layer.

FIG. 1 is a diagram illustrating a sectional view of a wafer having a stack structure of a conventional substrate with a strained silicon layer. The wafer 100 may includes heteroepitaxial layers of a starting silicon platform (e.g., substrate) 101, a silicon germanium (SiGe) alloy graded relaxed buffer layer 102, and a strained silicon layer 104.

The relaxed SiGe layer 102 is formed upon or deposited on top the silicon substrate 101. The strained silicon layer 104 is then formed on the relaxed SiGe layer 102. In one embodiment, the relaxed SiGe layer 102, and the strained silicon layer 104 are formed by an epitaxial growth process. In other words, the process includes epitaxial growth of relaxed SiGe on the silicon wafer 101 to create the relaxed SiGe layer 102, epitaxial growth of a thin silicon film on the stack structure of the silicon wafer 101 to create the strained silicon film 104. The relaxed SiGe layer has the thickness in the range of approximately from 0.1 to 3.0. It is contemplated that the forming of these layers in the stack structure may be done in any other process other than the epitaxial growth process.

Figure 2:
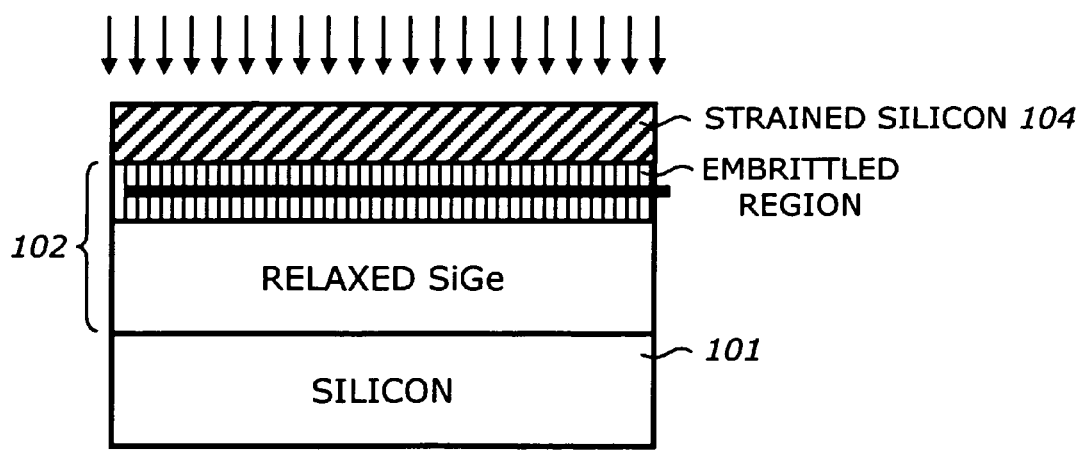
FIG. 2 is a diagram illustrating FIG. 1 with an implantation of hydrogen onto the substrate to create stress according to one embodiment of the invention.

FIG. 2 is a diagram illustrating FIG. 1 with an implantation of an ion onto the substrate to create stress according to one embodiment of the invention. With the stack structure of the silicon wafer 101 discussed in FIG. 1, in one embodiment, hydrogen ions are implanted into the silicon wafer 101 to create stress on the wafer. The implanting of the hydrogen ions is performed to result in an embrittled region in one of the layers in the stack structure of the wafer 101. In other words, the stress creates an embrittled region on one of the layers in the stack structure of the silicon wafer 101. The location of the embrittled region depends of the energy used in the implanting process. The energy level used in the implanting process is in the range from approximately 1 keV to 20 keV and the dose used is in the range from approximately $1E116/cm^3$ to $1E18/cm^3$. It is contemplated that the other type of ions may be used in place of hydrogen in the implanting process to create the embrittled region in the wafer 101.

Figure 3:
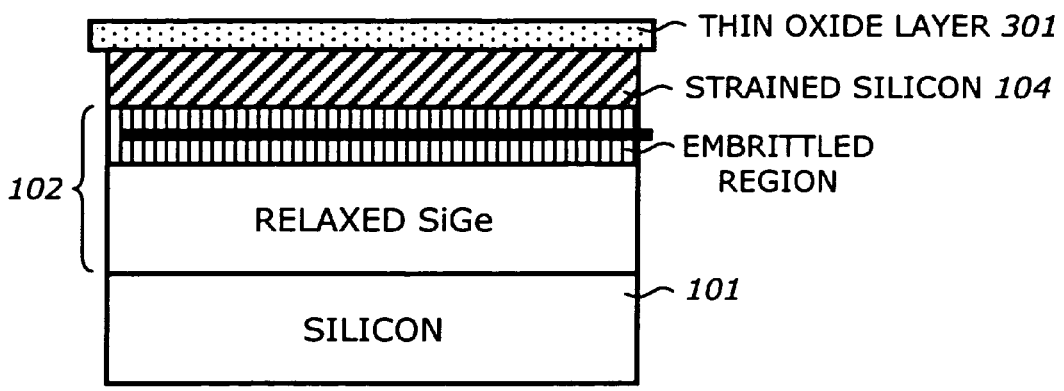
FIG. 3 is a diagram illustrating FIG. 2 with a deposition of oxide layer onto the strained layer according of one embodiment of the invention.

FIG. 3 is a diagram illustrating FIG. 2 with a deposition of oxide layer onto the strained silicon layer 104 according of one embodiment of the invention. A thin oxide layer 301 is deposited (i.e., grown) onto the strained silicon layer 104. The deposition of oxide layer 301 on the strained silicon film 104 is used for adhesion purpose. After the deposition process, a plasma treatment is applied on the surface of the silicon wafer 101. This plasma treatment is performed at low temperatures to ensure the bonding of the stack structures. The temperature may be in the range of approximately from 100° C. to 400° C.

Figure 4:
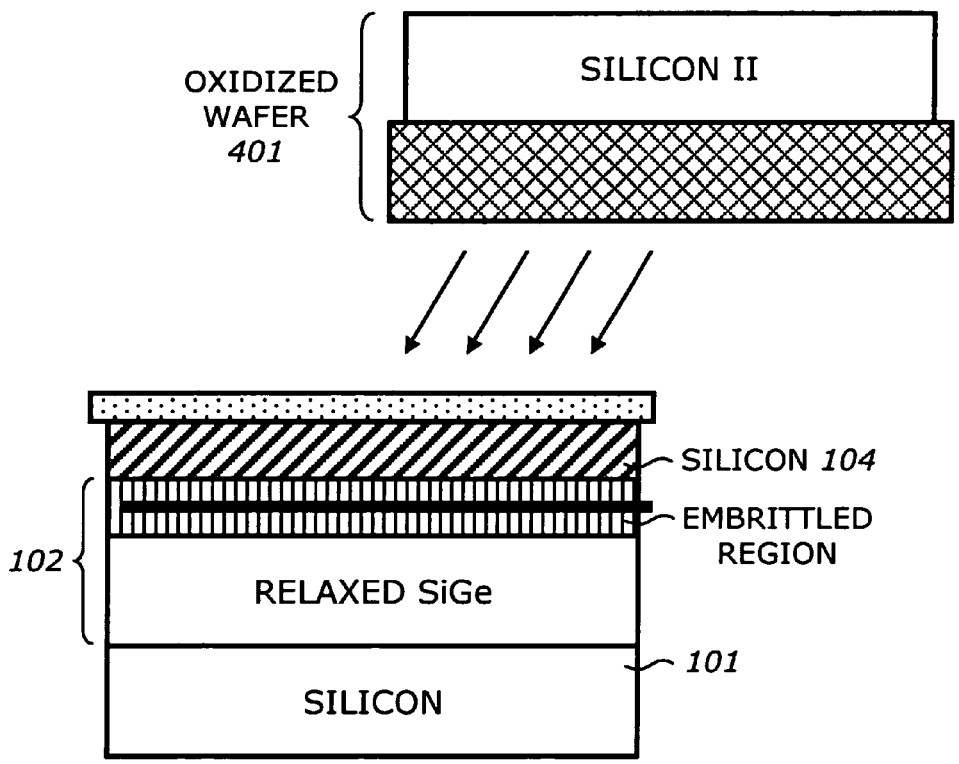
FIG. 4 is a diagram illustrating FIG. 3 brought in contact with oxidized silicon wafer according to one embodiment of the invention.

FIG. 4 is a diagram illustrating FIG. 3 brought into contact with the SOI substrate wafer (e.g., oxidized wafer) 401 according to one embodiment of the invention. The silicon wafer 101 as described in FIG. 3 is brought into contact with the SOI substrate wafer 401.

The oxidized wafer 401 is a SOI substrate wafer and is plasma treated before making contact with the silicon wafer 101. The strained silicon film 104 is later transferred to this oxidized wafer 401. Any well-known process may fabricate the SOI substrate 401.

Figure 5:
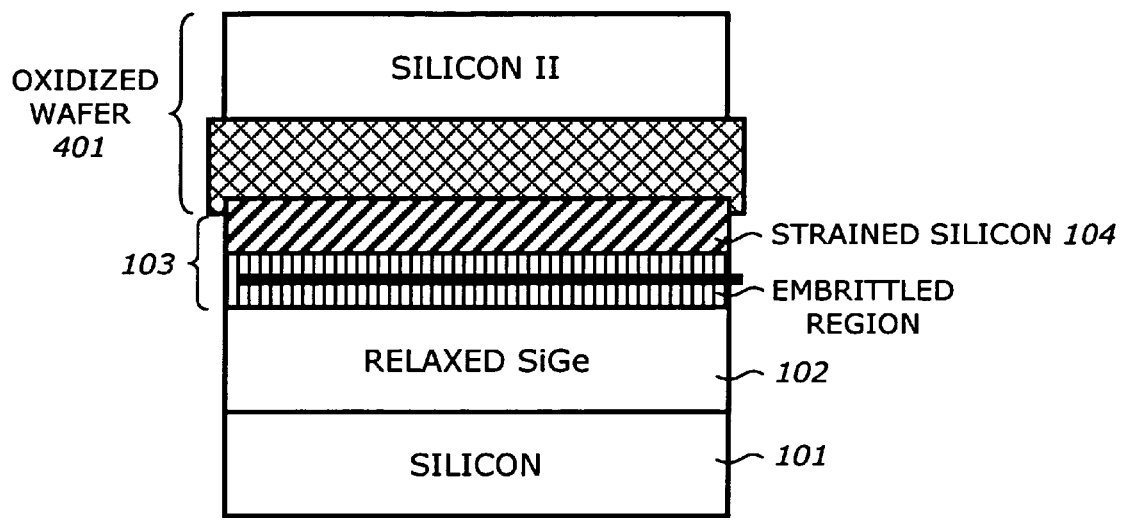
FIG. 5 is a diagram illustrating FIG. 4 having a heat treatment to bond the two wafers according to one embodiment of the invention.

FIG. 5 is a diagram illustrating FIG. 4 having a heat treatment to bond the two wafers according to one embodiment of the invention. Once the silicon wafer 101 and the oxidized wafer 401 are in contact, a heat treatment is performed on the two contacted wafers. The temperature used in the heat treatment is in the range of approximately 100° C. to 300° C. This heat treatment results in the bonding of the two wafers 101 and 401. In other words, the heat treatment on the two wafers causes the $SiO_2$ dangling bond on both of the wafer surfaces to bond to each other. It is noted that this technique is also well known in the art.

Figure 6:
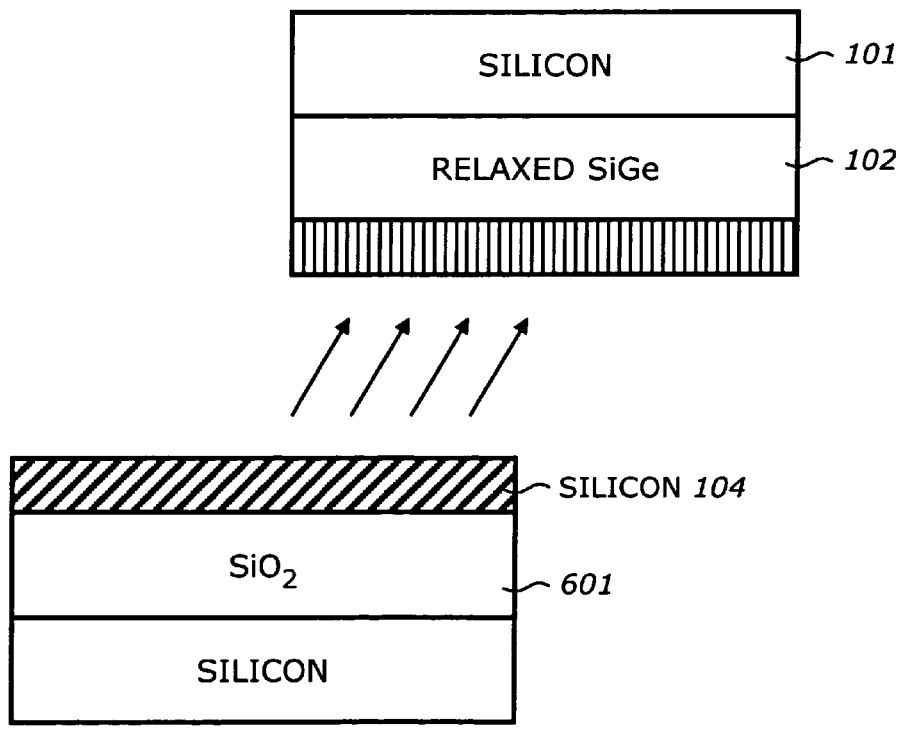
FIG. 6 is a diagram illustrating FIG. 5 with further heat treatment to transfers the strained layer to the oxidized wafer according to one embodiment of the invention.

FIG. 6 is a diagram illustrating FIG. 5 with further heat treatment to transfer the strained layer to the oxidized wafer according to one embodiment of the invention. After the lower heat treatment to result the bonding of silicon wafer 101 and oxidized wafer 401, higher temperature heat treatment is applied. This temperature used in this further heat treatment ranges from approximately 400° C. to 600° C. The higher temperature heat treatment results in the bonding of surface 104 to wafer 101 at the SiO2 interface 601. The further heat treatment also results in the separation of the two wafers at the embrittled region (described in FIG. 2). After the further heat treatment, the two wafers 101 and 401 are delaminated along the embrittled implanted region (i.e., H-implanted SiGe region). This effectively separates the two wafers and the strained silicon film 104 is transferred to the SOI-like wafer 401. In one embodiment, the embrittled region resides on the relaxed SiGe layer 102. When the two wafers 101 and 401 separate, the strained silicon layer 104 and the part of the relaxed SiGe layer 102 are transferred to the SOI wafer 401. Part of relaxed SiGe layer 102 is then etched off to result the wafer 401 with the strained silicon layer 104 on top of the $SiO_2$ layer. This results in the transfer of the strained silicon layer 104 to the SOI wafer 401 (e.g., oxidized wafer 401). It is contemplated that the etching may be wet or plasma etching; however, wet etching is used to better remove the entire SiGe residue on the strained silicon film.

In one embodiment where there is no implanting step (i.e., hydrogen implant), the embrittled region is not formed. The strained silicon layer 103 is transferred to the SOI wafer 401 by a bonded-etchback process on the silicon wafer 101 and the strained SiGe 103. This gives the strained silicon film on the SOI wafer 401.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
    forming a relaxed layer on a silicon layer;
    forming a strained layer on the relaxed layer;
    creating an embrittled region in one of the relaxed and strained layers; and
    transferring the strained layer to top of a wafer by heat treatment, the wafer having a base substrate and an oxidized film.

2. The method of claim 1 wherein forming a relaxed layer comprises: forming a relaxed silicon germanium (SiGe) layer having a thickness in a range of 0.1 μm to 3.0 μm.

3. The method of claim 1 wherein creating comprises:
    creating the embrittled region by an ion implantation.

4. The method of claim 1 wherein creating comprises:
    creating the embrittled region by an ion implantation using an energy range of approximately 1 keV to 20 keV.

5. The method of claim 1 wherein creating comprises: creating the embrittled region by an ion implantation using a dose range of approximately $1E16/cm^3$ to $1E18/cm^3$.

6. The method of claim 1 wherein transferring comprises:
    bonding the strained layer to the oxidized wafer by a first heat treatment in a range of approximately 100° C. to 300° C.; and
    separating the strained layer from the relaxed layer at the embrittled region by a second heat treatment in a range of approximately 400° C. to 600° C.

* * * * *